United States Patent
Ota et al.

(10) Patent No.: US 8,821,741 B2
(45) Date of Patent: Sep. 2, 2014

(54) SUBSTRATE PROCESSING METHOD AND SUBSTRATE PROCESSING APPARATUS

(71) Applicant: Dainippon Screen Mfg. Co., Ltd., Kyoto (JP)

(72) Inventors: Takashi Ota, Kyoto (JP); Akio Hashizume, Kyoto (JP); Takahiro Yamaguchi, Kyoto (JP); Yuya Akanishi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/687,503

(22) Filed: Nov. 28, 2012

(65) Prior Publication Data

US 2013/0161287 A1   Jun. 27, 2013

(30) Foreign Application Priority Data

Dec. 22, 2011  (JP) .................................. 2011-281688
Aug. 9, 2012   (JP) .................................. 2012-177220

(51) Int. Cl.
     *C03C 15/00*       (2006.01)
(52) U.S. Cl.
     USPC ............ 216/57; 216/37; 216/67; 156/345.28

(58) Field of Classification Search
     USPC .................................. 216/37, 57, 67; 156/345
     See application file for complete search history.

(56) References Cited

U.S. PATENT DOCUMENTS 6,143,063 A  * 11/2000 Hayashi et al. .......... 106/287.18
6,534,413 B1    3/2003 Robertson, III et al. ...... 438/706
6,676,760 B2 *  1/2004 Kholodenko et al. ........ 118/728

FOREIGN PATENT DOCUMENTS

| JP | 2001-015481 | 1/2001 |
| JP | 2002-075955 | 3/2002 |
| JP | 2002-184750 | 6/2002 |
| JP | 2002-219699 | 8/2002 |
| JP | 2009-188411 | 8/2009 |

* cited by examiner

*Primary Examiner* — Duy Deo
*Assistant Examiner* — Maki Angadi
(74) *Attorney, Agent, or Firm* — Ostrolenk Faber LLP

(57) ABSTRACT

A preprocess step for supplying an inert gas into an enclosed space in which a substrate is disposed, while exhausting gas by sucking out of the enclosed space. And then, an etching step for supplying a process vapor into the enclosed space while exhausting gas out of the enclosed space at an rate lower than a rate in the preprocess step. And then a post-process step for supplying an inert gas into the enclosed space while exhausting gas by sucking out of the enclosed space at a rate higher than the rate in the etching step.

7 Claims, 10 Drawing Sheets

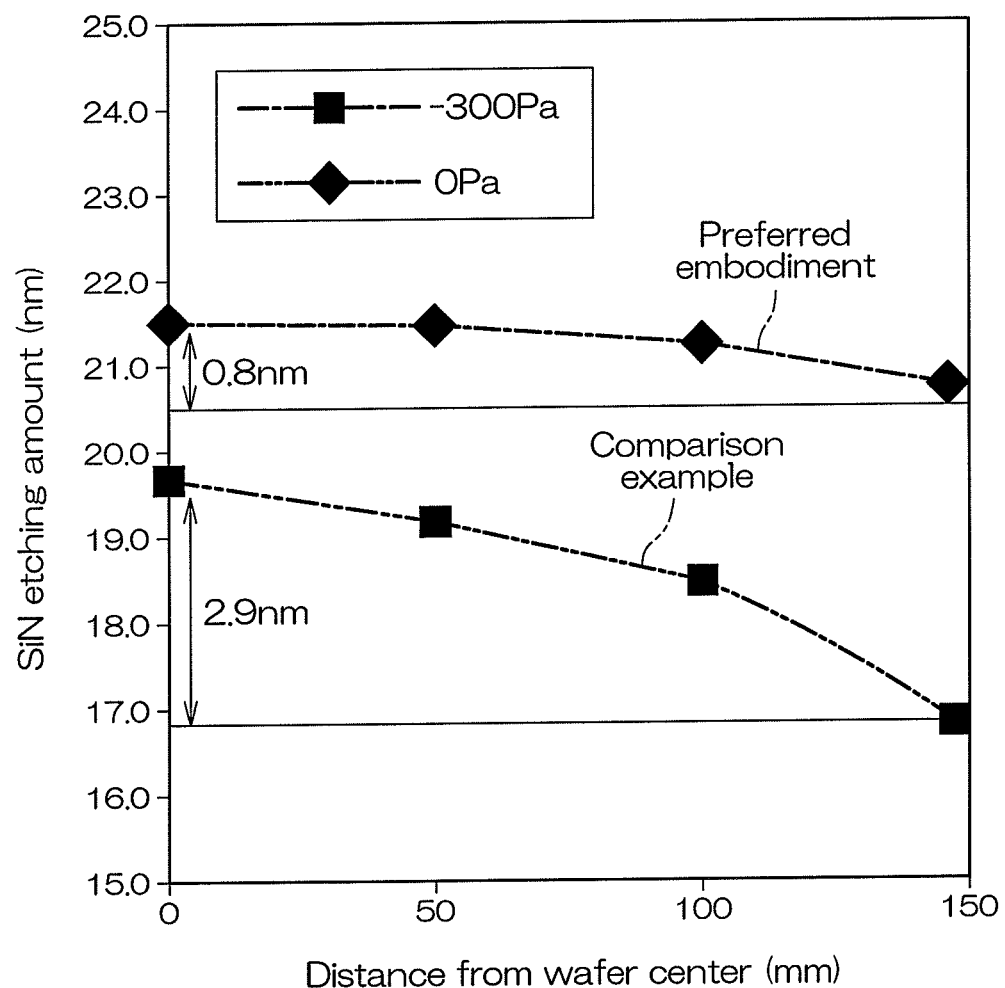

| | Evacuation pressure =-300Pa | Evacuation pressure ≧0Pa |
|---|---|---|
| Schematic view of vapor flow |  |  |
| HF concentration on wafer |  |  |
| HF vapor diagram |  |  |

FIG. 4C

| | Evacuation pressure =-500Pa | Evacuation pressure ≧-100Pa |
|---|---|---|
| Schematic view of vapor flow | HF vapor chamber<br>N2 → ... → Evacuation | HF vapor chamber<br>N2 → ... → Evacuation |
| HF condensed phase diagram | SiN / Si sub. | SiN / Si sub. (with condensed droplet) |

SUBSTRATE PROCESSING METHOD AND SUBSTRATE PROCESSING APPARATUS

BACKGROUND OF THE INVENTION

1. Field of the Invention

The present invention relates to a substrate processing apparatus and a substrate processing method for processing substrates with process liquids. Examples of substrates to be processed include semiconductor wafers, glass substrates for liquid crystal displays, glass substrates for plasma displays, substrates for FEDs (field emission displays), substrates for optical discs, substrates for magnet-optical discs, glass substrates for photomasks, substrates for ceramics, substrates for solar cells, etc.

2. Description of Related Art

In the manufacturing steps of semiconductor or liquid crystal display apparatus, hydrofluoric acid is supplied onto substrates such as semiconductor wafers, glass substrates for liquid crystal displays, to conduct etching step for eliminating unwanted film from substrates or cleaning step for eliminating particles from substrates. For example, JP-A-2001-15481 discloses a substrate etching apparatus for etching substrates. In this etching apparatus, hydrofluoric acid vapor, filled in a chamber accommodating substrates, is supplied onto a substrate. Supplying of hydrofluoric acid vapor toward substrates is conducted while exhaust of gas in the chamber is being conducted.

Vapor etching with HF vapor (vapor that contains hydrofluoric acid) has inherent problems that are distinguished from problems encountered in so-called wet etchings. In vapor etching, HF vapor condensates on a substrate, changing its state from gas to liquid. Droplets of liquid formed by the condensation aggregate to form condensed state liquid (HF condensed state liquid) containing hydrofluoric acid and water on the substrate. As the condensation process takes place on the entirety of the substrate, the vapor continues to condense in drops; which coalesce and grow to be a film-like HF condensed state formed on the whole substrate area. Water on or around the substrate dissolves into the HF condensed phase liquid.

Processing substrates with HF vapor would typically take about several 10 seconds to several 10 minutes, depending on HF density or types of substrate. Substrate etching is sustained as long as HF vapor supply to the substrate is maintained. Because HF component in HF vapor is consumed by etching processing, new HF vapor is required to be replenished onto the substrate. Therefore, it is required that HF vapor be supplied onto the substrate in an uniform flow rate across the substrate, in order to uniformly etch the whole substrate area.

In a case of an etching apparatus described in JP-A-2001-15481, HF vapor is exhausted at a given exhaust flow rate out of its chamber during its operation. This tends to incur bias in the HF vapor flow across its substrate, and accordingly bias in HF density distribution within its etching chamber. Thus a non-uniform condensed phase could be formed on the substrate, which can cause resultant unevenness of the substrate processing. The unevenness should be particularly conspicuous for etching on peripheral portions of substrates wherein relative pace of etching thereof slows down, to degrade process uniformity. Such degradation of process uniformity can happen not only in cases of substrate processing with hydrofluoric acid vapor, but also with vapor containing components other than hydrofluoric acid.

SUMMARY OF THE INVENTION

Therefore, it is an object of the present invention to provide a substrate processing method and a substrate processing apparatus which enables superior uniformity of substrate processing.

A preferred embodiment of the present invention provides a substrate processing method comprising: a preprocess step for supplying an inert gas into an enclosed space in which a substrate is disposed, while exhausting gas by sucking out of the enclosed space at a preprocess exhaust flow rate; an etching step after the preprocess step for supplying a process vapor into the enclosed space while exhausting gas out of the enclosed space at a etching exhaust flow rate lower than the preprocess exhaust flow rate to form a film liquid on the substrate through condensation of the process vapor, and etching the substrate with the film liquid; and a post-process step after the etching step for supplying an inert gas into the enclosed space while exhausting gas by sucking out of the enclosed space at a post-processing exhaust flow rate higher than the etching exhaust flow rate.

The substrate processing method may be a etching method for etching substrates, a cleaning method for cleaning a substrate by etching away foreign materials adhered thereon, or treating method for treating a substrate with vapor. In other words, the process vapor may be a etching vapor containing components for etching, a cleaning vapor containing components for cleaning, or a vapor containing other components. The process vapor may be a gas obtained by evaporating solid or liquid process components, or may be a gas composed of the vaporized process components and carrier gas (for example, inert gas).

According to this method, exhaust of gas by sucking out of an enclosed space and supply of an inert gas into an enclosed space are conducted in parallel. This results in decrease of atmospheric moisture amount and oxygen density. And then exhaust of gas out of the enclosed space and supply of a process vapor into the enclosed space are conducted in parallel. This allows the enclosed space to be filled with the process vapor, also allows the process vapor to be efficiently delivered onto the substrate with low atmospheric moisture and oxygen density. Consequently, this method keeps substrate processing quality under control for cases such that substrate processing quality depends on atmospheric moisture of oxygen density. Thereafter, exhaust of gas by sucking out of the enclosed space and supply of an inert gas into the enclosed space are conducted in parallel. This results in replacement of the process vapor in the enclosed space for the inert gas. This prevents the process vapor from leaking out of the enclosed space when the enclosed space is opened up to the outer space thereof.

In a substrate processing with process vapor, density gradient of process vapors that flow across the substrate deeply affect processing uniformity. Thereby it is required that a density gradient of a process vapor across the substrate be uniform; as well as maintaining the density of the process vapor above requisite value.

Gas is exhausted out of an enclosed space in the aforementioned preprocess step, etching step, and post-processing. Exhaust flow rate (flow volume) in the etching process is lower than those in the preprocess step or post-process step. Higher exhaust flow rate may cause larger variation of the flow velocity of gas across the substrate due to high-speed flow of the gas within the enclosed space; whereas the exhaust flow rate in the etching process is low, resulting in a small amounts of variations among flow rates of gas across the substrate. Thereby uniform supply of process vapor across the whole surface area of the substrate can be achieved.

The etching step may include at least one of the following steps: (a) an weak exhausting step for supplying the process vapor into the enclosed space while exhausting gases by sucking out of the enclosed space at the etching exhaust flow rate; and (b) a suction halt step for supplying the process vapor into the enclosed space while exhausting gases out of the enclosed space at the etching exhaust flow rate, with the suction being halted.

It should be apparent that the etching step may include a step for supplying a process vapor to the substrate while either actively weakly exhausting gas out of the enclosed space or passively exhausting (with the suction being halted). It should also be apparent that the etching step may include both the weak exhausting step and suction halt step; that is, the etching step may be defined by either one of the weak exhausting step and suction halt step followed by another one of the steps. In either case, low exhaust flow rate in the etching step permits smaller variation of exhaust flow rate of gas across the substrate. Thus can be achieved uniform supply throughout the whole of the substrate surface, which results in uniform treatment throughout the whole of the substrate surface.

The substrate processing method may further comprise a replacing step for supplying a process vapor into the enclosed space while exhausting gas by sucking out of the enclosed space at a replacing exhaust flow rate higher than the etching exhaust flow rate, wherein the replacing step is conducted after the preprocess step and before the etching step.

According to this method, process vapor is supplied into the enclosed space while gases are actively exhausted out of the enclosed space. And then the process vapor is supplied into the enclosed space, maintaining the low rate of exhaust out of the enclosed space. Replacement of gas in the enclosed space can be processed in a short time; owning to parallel execution of active exhaust of gas out of, and supply of process vapor into the enclosed space. This permits immediate start of the chemical reactions between the substrate and process vapor. Furthermore, because the process vapor is supplied into the enclosed space maintaining the low rate of exhaust therefrom after the above replacement, the whole substrate surface area can be uniformly processed.

The substrate processing method may further comprise a repetition step that alternates the replacing and etching step for a plurality of times before the post-process step.

According to this method, process vapor is supplied into the enclosed space while gases are actively exhausted out of the enclosed space. And then the process vapor is supplied into the enclosed space, maintaining the low rate of exhaust out of the enclosed space. Subsequently these steps are repeated again. The repetition of the steps allows the replacement of process vapor in the enclosed space with new process vapor. Thereby less active process vapor can be replaced with more active process vapor, permitting higher process efficiency.

The enclosed space may contain a cover having communication holes through which fluid flows between the inside and outside of the cover, and the etching step may include a step for supplying a process vapor into the inside of the cover in a state such that the substrate is covered by the cover while exhausting gas out of the outside of the cover.

According to this method, process vapor is supplied into the inside of the cover (inside space). This causes the gas in the cover to be pushed out of the cover through the communication hole; and then the pushed-out gas join the gas in the enclosed space, and are exhausted out of the enclosed space together. Thus replacement of gas in the cover with process vapor, and supply of process vapor to the substrate can be conducted. Furthermore, gas inside the cover flow more slowly because the flow is impeded by the inner surface of the cover. This contributes to smaller amounts variations among flow rates of gas across the substrate, permitting even more uniform processing for the whole substrate surface.

The etching step may include a step for supplying a process vapor into the enclosed space in a state such that the substrate is encircled by a circular protection wall while exhausting gas out of the enclosed space.

According to this method, process vapor is supplied into the enclosed space with a circular protection wall encircling the substrate. Flow of process vapor supplied to the substrate, which would flow along the substrate surface, will be blocked by the protection wall as to flows from peripheral portions of the substrate toward outside. This makes the gas across the substrate flow in a further slower flow rate, which leads to further decrease of flow rate of gas across the substrate. Thus, the whole substrate surface area can be even more uniformly processed.

The substrate processed according to this method may be a substrate having a nitride film formed thereon (a substrate with nitride film exposed). It should be apparent that other types of substrates such as substrates with thin film other than nitride film formed thereon or substrates with no thin film thereon (bear wafer) may be treated with this method.

The substrate processing method may include a substrate rotating step for rotating the substrate around an axis passing through the substrate center. This allows process vapor to be more uniformly supplied onto the substrate, improving uniformity of processing.

Another preferred embodiment of the present invention provides a substrate processing apparatus comprising: a process chamber for having an enclosed space disposed thereinside; a substrate holding unit for holding a substrate in the enclosed space; a process vapor supply unit for supplying a process vapor into the enclosed space; an inert gas supply unit for supplying an inert gas into the enclosed space; an exhaust unit for exhausting gases by sucking out of the enclosed space; and a controller for controlling the process vapor supply unit, inert gas supply unit, and exhaust unit. The controller executes: a preprocess step for supplying the inert gas into the enclosed space by the inert gas supply unit, while exhausting gases by sucking out of the enclosed space at a preprocess exhaust flow rate by the exhaust unit; an etching step after the preprocess step for supplying the process vapor into the enclosed space by the process vapor supply unit, while exhausting gases out of the enclosed space into the exhaust unit at an etching exhaust flow rate lower than the preprocess exhaust flow rate to form a film liquid on the substrate through condensation of the process vapor, and etching the substrate with the film liquid; and a post-process step after the etching step for supplying the inert gas into the enclosed space by the inert gas supply unit, while exhausting gases by sucking out of the enclosed space at a post-processing exhaust flow rate higher than the etching exhaust flow rate by the exhaust unit. This configuration allows for effects similar to those achieved with the aforementioned configuration.

The controller may execute at least one of the following steps: (a) an weak exhausting step for supplying the process vapor into the enclosed space by the process vapor supply unit, while exhausting gases by sucking out of the enclosed space at the etching exhaust flow rate by the exhaust unit; and (b) a suction halt step for supplying the process vapor into the enclosed space by the process vapor supply unit, while exhausting gases out of the enclosed space at the etching exhaust flow rate by the exhaust unit, with the suction being halted. This configuration allows for effects similar to those achieved with the aforementioned configuration.

The controller may further execute a replacing step for supplying a process vapor into the enclosed space by the process vapor supply unit, while exhausting gases by sucking out of the enclosed space at a replacing exhaust flow rate higher than the etching exhaust flow rate by the exhaust unit, and wherein the replacing step is conducted after the preprocess step and before the etching step. This configuration allows for effects similar to those achieved with the aforementioned configuration.

The controller may further execute a repetition step which alternates the replacing step and etching step for a plurality of times before the post-process step. This configuration allows for effects similar to those achieved with the aforementioned configuration.

The substrate processing apparatus may further include a cover being disposed in the enclosed space, covering the substrate, having communication holes through which fluids flow between the inside and outside of the cover. And the controller may execute the etching step including a step for supplying a process vapor into the inside of the cover by the process vapor supply unit, while exhausting gases out of the outside of the cover into the exhaust unit. This configuration allows for effects similar to those achieved with the aforementioned configuration.

The substrate processing apparatus may further comprise a circular protection wall that encircles the substrate held by the substrate holding unit, wherein the controller executes the etching step including a step for supplying a process vapor into the enclosed space by the process vapor supply unit in a state such that the substrate is encircled by a circular protection wall while exhausting gases out of the enclosed space into the exhaust unit. This configuration allows for effects similar to those achieved with the aforementioned configuration.

The aforementioned and other objects, features, and effects of the present invention shall be clarified by the following description of the following preferred embodiments with references to the accompanying drawings.

BRIEF DESCRIPTION OF THE DRAWINGS

FIG. 4A illustrates uniformity of etching in case of decreased exhaust flow rate and in case of not-decreased exhaust flow rate in etching step.

FIG. 4C illustrates condition of condensed phase on substrate in case of decreased exhaust flow rate and in case of not-decreased exhaust flow rate in post-process step.

DETAILED DESCRIPTION OF PREFERRED EMBODIMENTS

Figure 1:
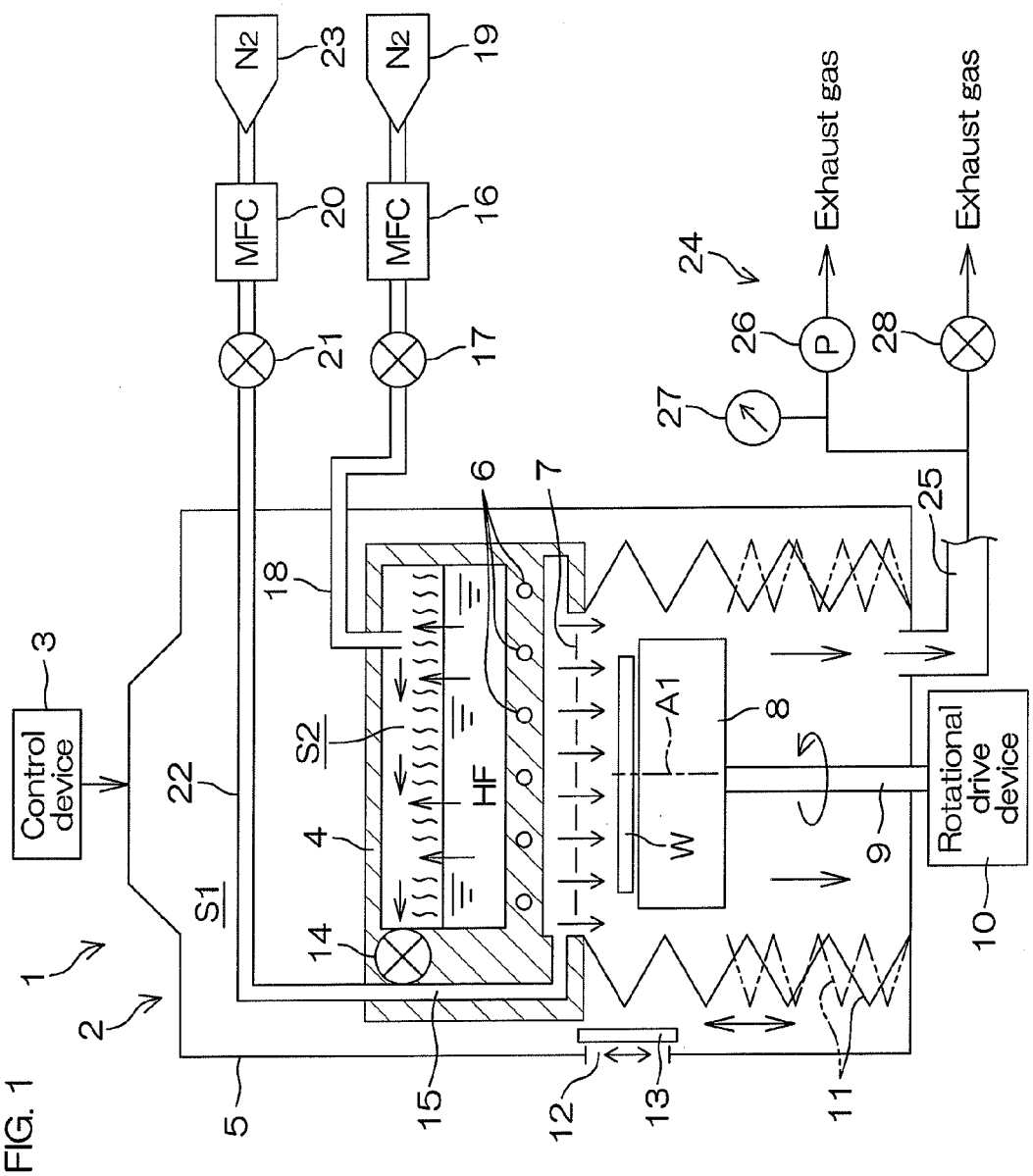
FIG. 1 is a schematic side view of a part of substrate processing apparatus according to the first preferred embodiment.

FIG. 1 is a schematic side view of a part of substrate processing apparatus according to the first preferred embodiment.

The substrate processing apparatus 1 is a single-wafer type of substrate processing apparatus that processes circular substrates (wafer) W such as semiconductor wafers one single wafer at a time. The substrate processing apparatus 1 comprises a process unit 2 for processing substrate W, and control device 3 for controlling actions of machines provided in the apparatus 1 and opening/closing of valves.

The process unit 2 is a vapor process unit for supplying vapors containing hydrogen fluoride (an example of process vapor) onto the substrate W. The process unit 2 is includes a HF vapor generator 4 (process vapor supply unit, inert gas supply unit), and chamber 5 (process chamber) with an enclosed space S1 containing the HF vapor generator 4 disposed thereinside. The density of hydrofluoric acid within the vapor generator 4 is adjusted so as to render a so-called pseudo-azeotropic composition (for example, about 39.6% in density at 1 standard atmospheric pressure, at room temperature). The HF vapor generator 4 heats hydrofluoric acid by a HF heater 6 built thereinside. The temperature of hydrofluoric acid in the HF vapor generator 4 is controlled by the control device 3.

The process unit 2 includes a perforated plate 7 disposed below the HF vapor generator 4, and a hot plate 8 disposed below the perforated plate 7. The hot plate 8 is an example of substrate holding units holding substrate W, as well as an example of substrate heaters heating substrate W. Hot plate 8 horizontally holds the substrate W in a substrate holding position (shown in FIG. 1) such that the upper face of the substrate W faces the perforated plate 7. The substrate W is held while being heated by the hot plate 8. The temperature of the substrate W is maintained within a given range (for example 30 to 100 degrees in Celsius) by the control device 3. When rotational drive device 10 including motor etc. rotates a rotational shaft 9 connected therewith; causes the hot plate 8 connected with the shaft 9 to rotate around the vertical rotational axis A1 passing through the center of the substrate W. Thereby the substrate W held by the hot plate 8 rotates around the vertical rotational axis A1.

The process unit 2 further includes a cylindrical bellows 11 disposed around the hot plate 8 encircling thereof, a sliding unit (not shown) that extends/contracts extendable the cylindrical bellows 11, a shutter 13 that opens/closes an opening 12 formed on the side wall of the chamber 5, and open/close unit (not shown) that moves the shutter 13. Hot plate 8 is disposed inside the bellows 11. The opening 12 is disposed facing the hot plate 8. The sliding unit extends/contracts the bellows 11 within an area between an enclosing position (solid line) at which the upper peripheral portion of the bellows 11 contacts the perforated plate 7 to enclose the space surrounding the hot plate 8 and a retreating position (alternate long and two short dashes line) at which the upper peripheral portion of the bellows 11 retreats below the upper face of the hot plate 8. The open/close unit moves the shutter 13 within a space between an opening position at which the opening 12 is opened and a closing position (shown in FIG. 12) at which the opening 12 is closed.

The HF vapor generator 4 includes a vapor generate space S2 filled with hydrofluoric acidic vapor (gas generated from hydrofluoric acid evaporation) and a flow path 15 connected with the space S2 via a communication valve 14. HF vapor generator 4 is connected with a first pipe 18 that is interposed with a first flow rate controller 16 and a first valve 17. HF vapor generator 4 is connected with a first nitrogen gas supply source 19 via the first pipe 18. Nitrogen gas (a type of inert gas) is supplied to the vapor generator S2 via the first pipe 18. Likewise the flow path 15 is connected with a second pipe 22 that is interposed with a second flow rate controller 20 and a second valve 21. The flow path 15 is connected with a second nitrogen supply source 23 via the second pipe 22. Nitrogen gas is supplied to the flow path 15 via the second pipe 22.

The control device 3 opens/closes the communication 14, the first valve 17. With the communication valve 14 and the first valve 17 are opened, the flow of nitrogen gas from the first nitrogen gas supply source causes hydrofluoric acid vapor in the vapor generator S2 to be supplied to the flow path 15 via the communication valve 14. Accordingly, with the valve 14, 17, 21 opened, the flow of nitrogen gas from the second nitrogen supply source 23 causes HF vapor (gas containing hydrofluoric acid vapor and nitrogen gas) supplied to the flow path 15 to be led into the perforated plate 7. Thereby, the HF vapor passes through multiple through hole formed on the perforated plate 7, hitting the upper face of the substrate W held by the hot plate 8. When only the second valve 21 is opened, what it is only the nitrogen gas that is brought to the perforated plate 7; consequently the nitrogen gas blows onto the upper face of the substrate W.

The substrate processing apparatus 1 further includes a exhaust unit 24 for exhausting gas out of the chamber 5. The exhaust unit 24 includes a exhaust pipe 25 connected to a space inside the chamber 5 (the enclosed space S1), a exhaust device 26 (a pump) connected with the exhaust pipe 25, a pressure meter 27 for measuring atmospheric pressure within the exhaust pipe 25, and a relief valve 28 connected with the exhaust pipe 25.

The exhaust device 26 is connected to the space inside the chamber 5 (interior space of the bellows 11) via the exhaust pipe 25. With the exhaust device 26 activated, gas in the chamber 5 is exhausted out of the chamber 5 with the sucking forces exerted by the exhaust device 26. The exhaust of gas by the exhaust device 26 is conducted by sucking the gas out of the chamber 5 at a sucking power (exhaust pressure, or gauge pressure) set by the control device 3. The control device 3 controls the degree of sucking power of the exhaust device 26 in accordance with pressure values measured by the pressure meter 27.

The exhaust pressure ranges, for example, from more than minus 500 Pa to less than 0 Pa in gauge pressure, when sucking the exhaust pipe 25. Higher the exhaust pressure value yields stronger suction power exerted by the exhaust device 26. Stronger suction power by the exhaust device 26 results in the increase of exhaust flow rate (volume flow rate); whereas weaker suction power by the exhaust device 26 results in the decrease of exhaust flow rate. While the exhaust pipe 25 is exhausted by suction by the exhaust device 26 at a given exhaust pressure, pressure in the exhaust pipe 25 is maintained at the exhaust pressure.

The relief valve 28 is connected with the exhaust pipe 25 in the upstream side of the exhaust device 26. The relief valve 28 is closed when pressure in the chamber 5 is below a given pressure value, which is higher than atmospheric pressure, of the relief valve 28. When the pressure in the chamber 5 reaches up to the given pressure value, the relief valve 28 opens to exhaust gases in the bellows 11. This causes the pressure in the chamber 5 to decrease, thus the relief valve 28 closed again with time. Accordingly, by the workings of valve 28, the pressure in the chamber 5 is maintained: within a value below a given pressure value.

Now will be described an example of substrate W processing by the substrate processing apparatus 1. Specifically, a processing for etching LP-SiN thin film (Low Pressure-Silicon Nitride) that is a nitride film, formed on silicon substrate surface, by providing a vapor containing hydrogen fluoride onto the substrate surface.

Figure 2:
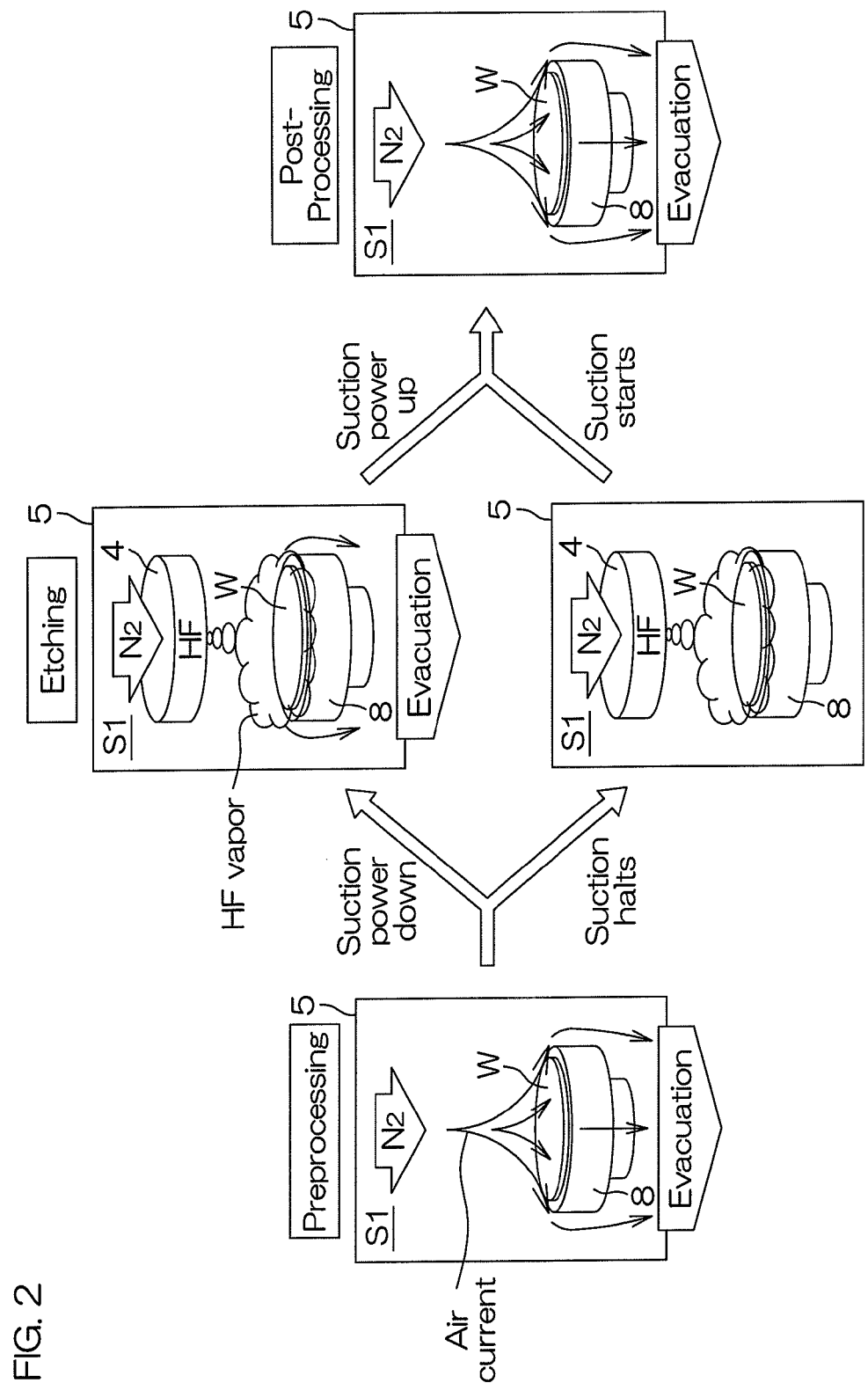
FIG. 2 schematically illustrates the first example of processing conducted by a substrate processing apparatus.

FIG. 2 schematically illustrates the first example of processing conducted by a substrate processing apparatus. The following description refers to FIG. 1 and FIG. 2.

To be treated by the process unit 2, a substrate W is transported into the chamber 5. To be more specific, the control device 3 controls a transport robot (not shown) to transport the substrate W into the chamber 5 with the bellows 11 positioned at retreat position and the shutter 13 positioned at opening position. And then the control device 3 controls the transport robot to retreat from the chamber 5, the bellows 11 to move to the enclosing position, and the shutter 13 to move to the closing position.

Thereafter, a preprocess step for replacing gas in the chamber 5 with nitrogen gas is executed. To be more specific, the control device 3 controls the rotational drive device 10 to rotate the substrate W held by the hot plate 8. Thereafter, the control device 3 opens the second valve 21, with the bellows 11 positioned at enclosing position and the exhaust device 26 exhausting gases by suction out of the exhaust pipe 25 at a preprocess exhaust pressure. The preprocess exhaust pressure is a given pressure ranges from minus 500 Pa to minus 300 Pa (for example, minus 300 Pa). By opening the second valve 21, nitrogen gas is supplied from the second pipe 22 into flow path 15; then is supplied from the perforated plate 7 into the interior of the bellows 11. Gas in the bellows 11 is sucked by exhaust device 26 into the exhaust pipe 25; and as well as is pushed into the exhaust pipe 25 by nitrogen gas supplied into the bellows 11. Thereby gas in the chamber 5 is replaced with nitrogen gas, decreasing the moisture quantity and oxygen density in the chamber 5. The control device 3 closes the second valve 21 after the completion of replacement of gas in the chamber with nitrogen gas.

Thereafter, an etching step for providing HF vapor to the substrate W is conducted. To be more specific, the control device 3 decreases suction power of the exhaust device 26, to lower exhaust flow rates in contrast to exhaust flow rates in the preprocess step. To do this, the control device 3 may either decrease exhaust pressures (or suction power) of the exhaust device 26 to a etching exhaust flow rate (for example, more than minus 300 Pa, less than 0 Pa) weaker than the preprocess exhaust flow rate, or deactivate suction by the exhaust device 26. The control device 3 opens the communication valve 14, the first valve 17, and the second valve 21, with exhaust flow rate decreased; thereby HF vapor passes through the through holes on the perforated plate 7, to be blown onto the rotating substrate W kept at a given temperature by the hot plate 8.

When the exhaust apparatus 26 is activated, the HF vapor blown onto the substrate W is sucked into the exhaust pipe 25 with suction power exerted by the exhaust device 26. When the exhaust apparatus 26 is deactivated, atmospheric pressure within the chamber 5 rises up to a given pressure value for the relief valve 28 (for example, more than 0 Pa, less than 100 Pa in gauge pressure), opening the relief valve 28; thereby exhausting the HF vapor blown onto the substrate W out of the chamber 5 through the exhaust pipe 25. Therefore as HF vapor is supplied to the substrate W, replacement of nitrogen gas in the bellows 11 with HF vapor is carried out. After a given lapse from when the communication valve 14, the first valve 17, and the second valve 21 are opened, the control device 3 closes the communication valve 14, the first valve 17, and the second valve 21 to deactivate supply of HF vapor to the substrate W.

Thereafter a post-process step for replacing gas in the chamber 5 with nitrogen gas. To be more specific, the control device 3 increase exhaust flow rates of gas from the chamber 5 in contrast to exhaust flow rates in the etching step. That is, the control device 3 increases exhaust flow rates (or suction power) exerted by the exhaust device 26 to a post-processing exhaust rate (for example, more than minus 500 Pa, less than minus 300 Pa. for example, minus 300 Pa). And then the control device 3 opens the second valve 21 with exhaust flow rates increased. Thereby as gas in the bellows 11 containing HF vapor is exhausted into the exhaust pipe 25 with suction power exerted by the exhaust device 26, is pushed out into the exhaust pipe 25 with the nitrogen gas supplied into the bellows 11. Thus gas in the bellows 11 is replaced with nitrogen gas. The control device 3 closes the second valve 21 after gas in the bellows 11 is replaced with nitrogen gas. And then the control device 3 stops the rotation of the substrate W.

Thereafter a transport step for transporting the substrate W out of the chamber 5 is executed. To be more specific, the control device 3 moves the bellows 11 from the enclosed position to the retreat position, and moves the shutter 13 from the closing position to the opening position. And then, with the bellows 11 and the shutter positioned at the enclosed and opening position respectively, the control device 3 controls the transport robot to transport the substrate W out of the chamber 5. Subsequently the control device 3 moves the shutter 13 to the closing position.

In the etching step, HF vapor is uniformly blown onto the upper face of the substrate W via the perforated plate 7. Exhaust flow rate in the etching step is lower than exhaust flow rates in the preprocess step or in the post-process step. Thereby flow velocity in the chamber 5 in the etching step is lower than flow velocity in the preprocess step or in the post-process step. Therefore the difference between flow velocities above the middle portion and the peripheral portion of the upper face of the substrate W is relatively small; thus the small variation of flow velocities at above the substrate W. This contributes to the uniform supply of HF vapor via the perforated plate 7 onto the whole upper face of the substrate W. This permits the condensation of HF vapor on the substrate W, and the formation of a uniform and ultrathin condensed phase liquid containing hydrogen fluoride and water on the whole upper face of the substrate W. Accordingly hydrogen fluoride and water is uniformly supplied over the whole upper face of the substrate W, permitting uniform etching of nitride film formed thereon.

Figure 3:
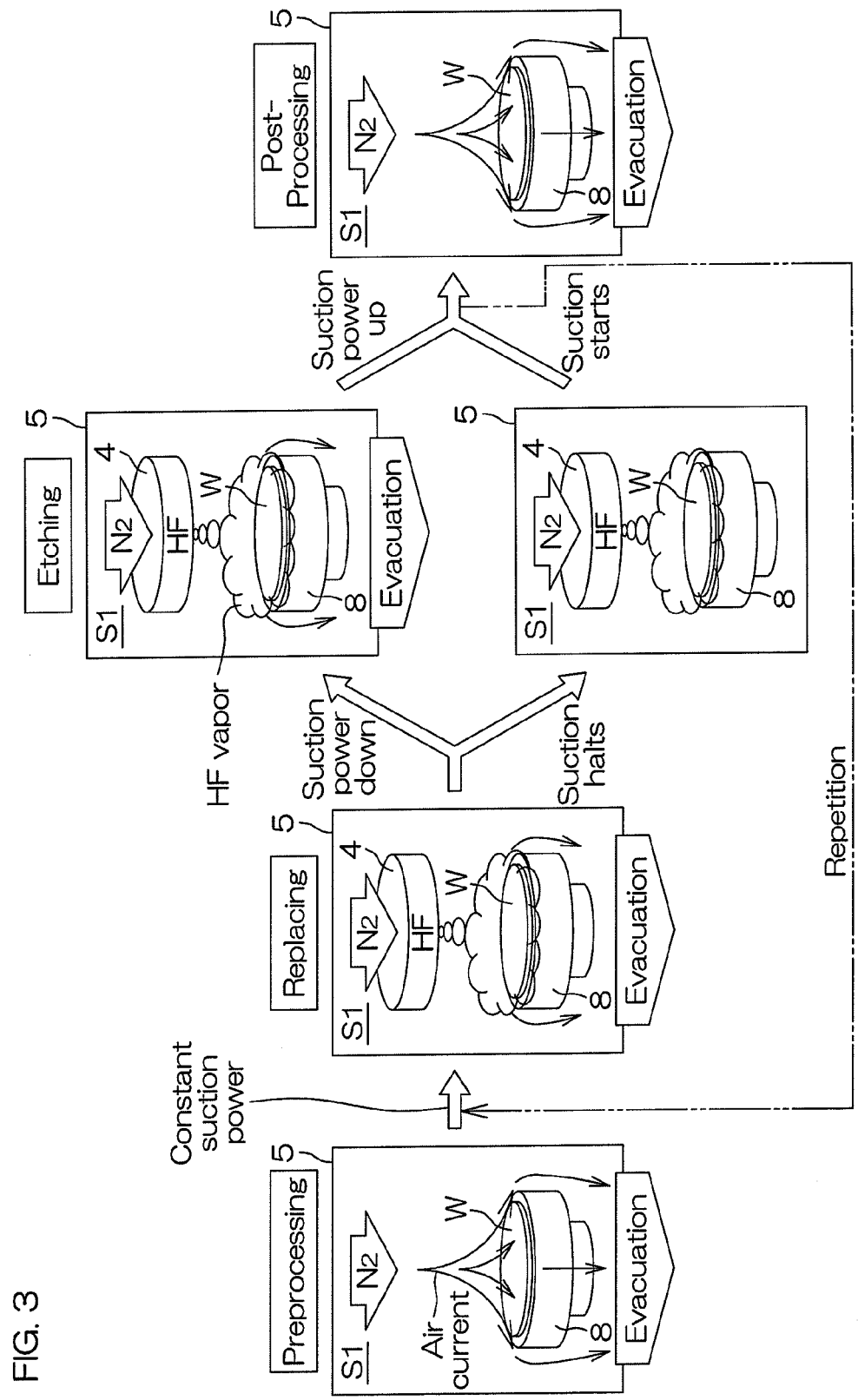
FIG. 3 schematically illustrates the second example of processing conducted by a substrate processing apparatus.

FIG. 3 schematically illustrates the second example of processing conducted by a substrate processing apparatus. The following description refers to FIG. 1 and FIG. 3.

Major difference between the first and second example of processing is, before the etching step taking place, the replacement step (FIG. 3) in the second example of processing replaces gas in the chamber 5 with HF vapor in short time by supplying HF vapor into the chamber 5 while exhausting gas out of the chamber 5 at the same exhaust flow rate as that in the preprocess step.

To be more specific, in the second example of processing, a transport step and then a preprocess step are conducted in the same manner as in the first example of processing. This is followed a replacement step for replacing gas in the chamber 5 with HF vapor. Specifically, the control device 3 opens the communication valve 14, the first valve 17, and the second valve 21, with exhaust pressure of the exhaust device 26 kept at a preprocess exhaust pressure. Therefore as HF vapor is supplied into the bellows 11, gas in the bellows 11 containing nitrogen gas is exhausted at the same exhaust flow rate as in the preprocess step. Thereby gas in the bellows 11 is replaced with HF vapor in short time. After the completion of replacement of gas in the bellows 11 with HF vapor, the control device 3 executes the aforementioned etching step, post-process step, and transport step.

The control 3 may either execute the post-process step right after the completion of the etching step; or execute the post-process step after sequentially completing the etching step, the replacement step, and the etching step. Stated another way, the control device may execute a repetition step wherein the preprocess step is followed by a cycle from the replacement step to etching step is repeated several times. Also the control device 3 may execute the post-process step after the repetition step. By executing the replacement step after the etching step, HF vapor in a degraded activity quality can be replaced with more active HF vapor. Thereby the process efficiency can be enhanced.

As shown hereinabove, gas in the chamber 5 is exhausted out of the chamber 5 by the supply of inert gas such as nitrogen gas in the first and second examples of processing (preprocess step). Thereafter HF vapor is supplied into the chamber 5, with lower exhaust flow rate than that in the prepress step (vapor etching step). Thereafter HF vapor in the chamber 5 is exhausted out of the chamber 5 by the supply of inert gas such as nitrogen gas (post-process step).

Either the preprocess step or the post-process step typically requires about 30 seconds to 1 minute, and the etching step typically takes several minutes, depending on HF density, processing object, or types of etching.

In the preprocess step, while gas in the chamber 5 is exhausted, temperature control is executed in order to prevent dew condensation. The dew condensation prevention is conducted to prevent the inner face of the chamber 5 or parts in the chamber 5 from being wet, or to prevent etching rate in the etching step from deviating. In the preprocess step, exhaust at a exhaust pressure that ranges, for example, from minus 500 Pa to minus 300 Pa is conducted in order to shorten the process time.

In the etching step, it is preferable that HF vapor flow across the substrate W in a uniform flow velocities, and fresh HF vapor be supplied onto the substrate W. Considering this, gas is exhausted at a exhaust pressure ranging from minus 300 Pa to 0 Pa in the etching step. Note that even when an exhaust pressure is 0 Pa, HF vapor would be somewhat exhausted. As etching processing proceeds, HF component in HF vapor is consumed; which necessitates the constant supply of fresh HF vapor onto the substrate W during the process. This is the main reason why constant exhaust of HF vapor is required.

In the post-process step, it is required that HF residue around the substrate W be totally and quickly eliminated, because locally remaining HF vapor on or above the substrate W can induce non-uniformity in processing. Therefore it is necessary that the whole area of the substrate be etch-stopped by replacing residue HF vapor with inert gas as quickly as possible after the termination of the etching step. It is also required that the post-process step should take shorter time. Accordingly, for example, exhaust in the post-process step is executed at minus 500 Pa to minus 300 Pa of exhaust pressure.

As described hereinabove, improvement on process uniformity of substrate W can be achieved in VPC (vapor phase cleaning) by changing exhaust pressure in the preprocess step, etching step, and post-process step. That is, sequential processing of preprocess, etching, and post-process (in this order) contributes to uniformity of substrate processing; thereby the whole surface area of substrate W is uniformly processed, or uniformly etched.

FIG. 4A illustrates uniformity of etching in case of decreased exhaust flow rate and in case of not-decreased exhaust flow rate in etching step. FIG. 4A shows relationship between radius of circular substrate (horizontal axis) and etching amounts for each radius (vertical axis).

Measurement values shown in alternate long and short dash lines and alternate long and two short dashes lines respectively correspond to the preferred embodiment and a comparison example, both sets of values regarding the processing of substrate W in accordance with the aforementioned first example of processing. The processing conditions are identical except exhaust pressure of the exhaust device 26 in the etching step. Specifically speaking, measurement values shown in alternate long and short dash lines and alternate long and two short dashes lines respectively correspond to a case that exhaust pressure is weaken (0 Pa of exhaust pressure) only in the etching step, and a case that exhaust pressure is kept constant (minus 300 Pa) from preprocess step to post-process step.

As shown in FIG. 4A, the amounts of etching is greater in the middle portion (in the vicinity of 0 mm in radius) than in the peripheral (in the vicinity of 150 mm in radius) of substrate W, in either case of the preferred example and comparison example. The difference between etching amounts in the middle and the peripheral in the case of the preferred example is smaller than in the case of the comparison example. Stated another way, the preferred example gives higher etching uniformity than the comparison example. Furthermore the preferred example shows higher amounts of etching at every position in the substrate W than the comparison example. Accordingly, by decreasing exhaust flow rate in the etching step, etching uniformity and efficiency can be enhanced.

Figure 4B:
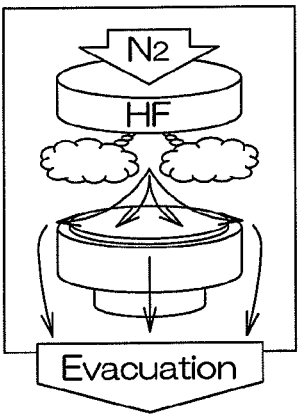
FIG. 4B illustrates HF density gradient on substrate in case of decreased exhaust flow rate and in case of not-decreased exhaust flow rate in etching step.
Figure 4B:
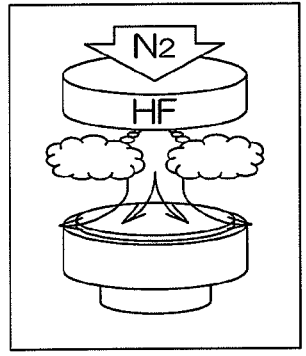
Figure 4B:
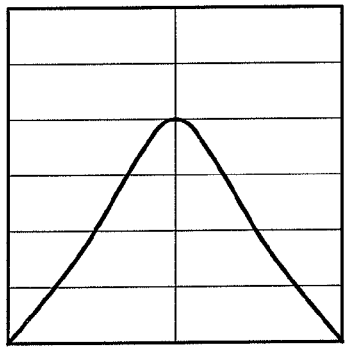
Figure 4B:
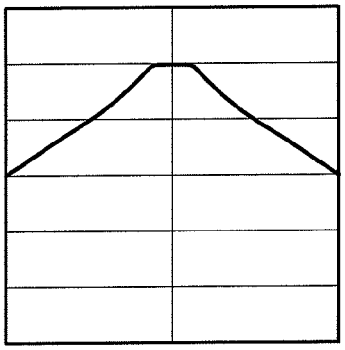
Figure 4B:
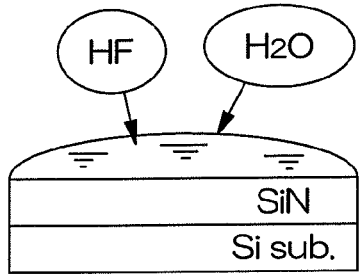
Figure 4B:
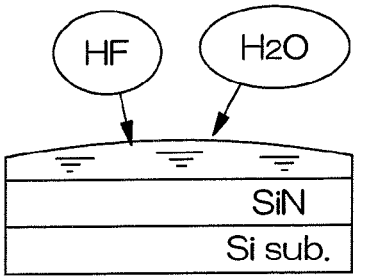

FIG. 4B illustrates HF density gradient on substrate in case of decreased exhaust flow rate (right column) and in case of not-decreased exhaust flow rate (left column) in etching step. FIG. 4C illustrates condition of condensed phase on substrate in case of decreased exhaust flow rate (right column) and in case of not-decreased exhaust flow rate (left column) in post-process step.

As shown in the left column of FIG. 4B, a strong suction power in exhausting gas out of a chamber permits the thickness of condensed phase liquid to become larger in peripheral than in inner area, due to the faster HF vapor flow rate in peripheral than in inner area. Thus the thickness of condensed phase liquid containing HF and water is non-uniform; hence the lower HF density in peripheral than in inner area of the substrate. In contrast to this, a decreased exhaust flow rate gives a lower flow rate of gas within the chamber; accordingly causes the thickness difference of condensed phase between in peripheral and in inner area; forming condensed phase liquid on the substrate in uniform thickness, as shown in the right column of FIG. 4B. Thereby HF densities variation on the substrate and etching uniformity can be improved.

Now, it is required that HF atmosphere should be replaced with inert gas immediately after the etching processing with HF vapor. As shown in the right column of FIG. 4C, a smaller exhaust flow rate permits HF condensed phase to be eliminated starting from peripheral portion of the substrate where the flow rate is relatively higher; resulting in a state such that the condensed phase still remains only in the inner area. Owning to the remaining condensed phase liquid, etching proceeds even while replacement of HF atmosphere taking place. In contrast to this, a stronger suction power in exhausting gas out of the chamber renders the instant elimination of condensed phase liquid, uniformly terminating etching process owning to almost instantaneous elimination of the condensed phase liquid as shown in the left column of FIG. 4C. Therefore a stronger suction power is exerted in post-process step than in etching step. Thereby processing uniformity can be improved.

As is shown hereinabove, in the first preferred embodiment, the flow velocity of gas in the chamber 5 is decreased by lowering suction power (exhaust pressure) of the exhaust device 26 in the etching step; thereby decreasing the variation of gas flow velocity across the substrate W. In etching process utilizing HF vapor, the density gradient of HF vapor flowing across the substrate W deeply affects the resultant process uniformity. Therefore in order to uniformly etch thin film such as SiN formed on substrate W or substrate itself, it is required that the density gradient of HF vapor across the substrate W be uniform, while keeping the density of HF vapor density above given density. Such requirement is satisfied by lowering variations of gas flow velocities across the substrate W to uniformly supply HF vapor onto the whole surface area of the substrate W as in explained above. Thereby the whole surface area of the substrate W can be uniformly processed. In other words, improvement on process uniformity can be achieved by controlling flow velocities of gas in the chamber 5.

The Second Preferred Embodiment

The second preferred embodiment of the invention will be described hereinbelow.

Figure 5:
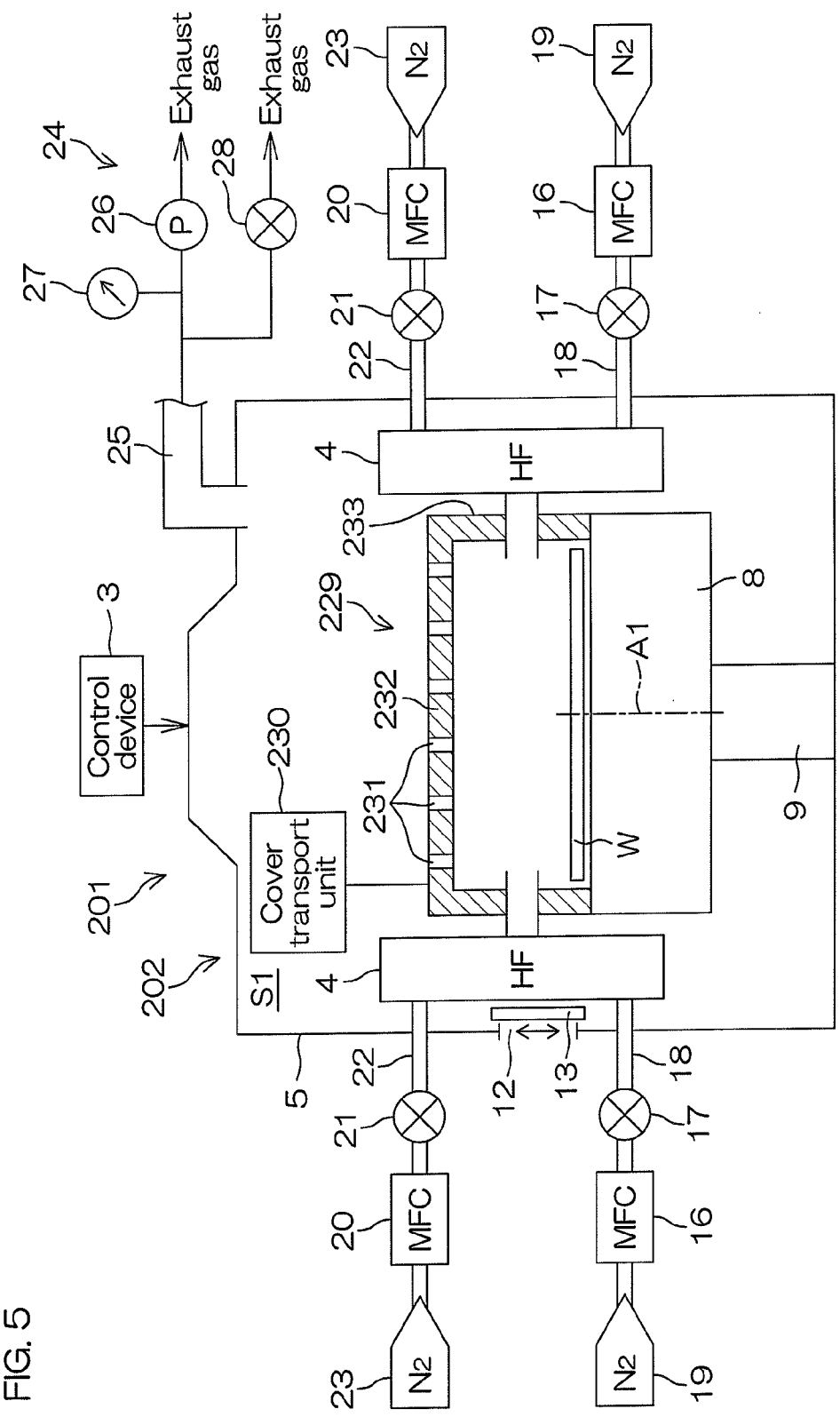
FIG. 5 is a schematic side view of a part of substrate processing apparatus according to the second preferred embodiment.
Figure 6:
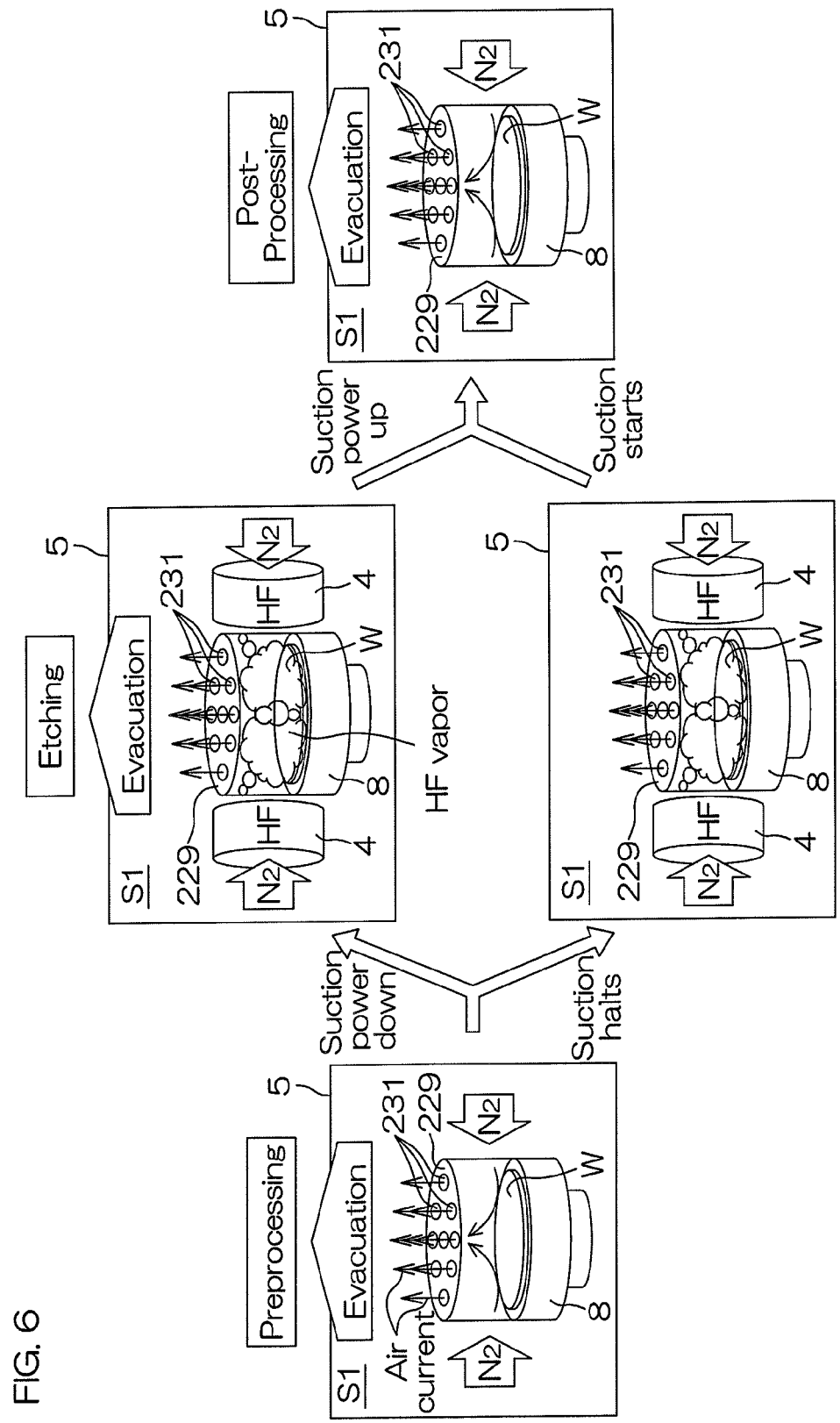
FIG. 6 schematically illustrates the third example of processing conducted by a substrate processing apparatus.

In FIG. 5 to FIG. 6, like parts shown in aforementioned FIG. 1 to FIG. 4 are given corresponding like reference numerals, and hence explanations thereof omitted.

FIG. 5 is a schematic side view of a part of substrate processing apparatus according to the second preferred embodiment.

A substrate processing apparatus 201 is configured in a similar manner as in the first preferred embodiment. To be more specific, the substrate processing apparatus 201 includes a process unit 202 instead of a process unit 202. The process unit 202 includes a plurality of HF vapor generators 4, a chamber 5, a perforated plate 7, a hot plate 8, and an exhaust unit 24. The process unit 202 also includes a process a cover 229 disposed in the chamber 5, and a cover transport unit 230 for transporting the cover 229 inside the chamber 5.

The cover 229, which is in the shape of a hood, is held up by the cover transport unit 230 in a upside down posture with its opening facing downward. The cover 229 includes a circular roof wall 232 with a plurality of communication holes 231 (through holes) formed thereon, and a cylindrical side wall 233 that downwardly extends from the outer peripheral portion of the roof wall 232. The inner diameter of the side wall 233 is greater than that of the substrate W. The side wall 233 also functions as protection wall for inhibiting gas flow out of the substrate W.

The cover transport unit 230 moves the cover 229 between a processing position at which a lower edge of the side wall 233 contacts an upper face of the hot plate 8 to surround the substrate W, and a retreat position at which the lower edge of the side wall 233 is above the substrate W. When the cover 229 is positioned at the processing position, the inside of the cover 229 (inside space) is enclosed, or sealed. Furthermore when the cover 229 is positioned at the processing position with the substrate W held by hot plate 8, the substrate W is covered by the cover 229, positioned inside the cover 229.

HF vapor generators 4 are disposed around the cover 229. HF vapor generator 4 is connected with the side wall 233. HF vapor generator 4 supplies gas (HF vapor or nitrogen gas) into the inside of the cover 229. When gas from the HF vapor generator 4 is supplied into the inside of the cover 229 with the cover 229 positioned at the processing position, the inside of the cover 229 is filled with gas from the HF vapor generator 4. Furthermore, due to the plurality of communication holes 231 formed on the roof wall 232, gas supplied into the inside of the cover 229 is exhausted to the exterior of the cover 229 via the communication holes 231. Thereby ascending air current is formed inside of the cover 229.

FIG. 6 schematically illustrates the third example of processing conducted by a substrate processing apparatus. The following description refers to FIG. 5 and FIG. 6.

A transport step for transporting the substrate W into the process unit 202 is executed to process the substrate W by the process unit 202. To be specific, the control device 3 transports the substrate W into the process unit 202 with the cover 229 positioned at the retreat position and the shutter 13 positioned at the opening position. Then the control device 3 transports the cover 229 to the processing position after retreating the transport robot out of the chamber 5, and transports the shutter 13 to the closing position. Thereby the substrate W held by the hot plate 8 is covered with the cover 229, and is disposed the inside of the now enclosed cover 229.

Thereafter a preprocess step for replacing gas in the chamber 5 with nitrogen gas. To be more specific, the control device 3 opens the first valve 21 with the exhaust device 26 sucking out of an exhaust pipe 25 at a preprocess exhaust pressure. Thereby, nitrogen gas from the HF vapor generator 4 is supplied to the cover 229, gas in the cover 229 is exhausted to the outside of the cover 229 via the communication holes 231. Then the exhausted gas is exhausted into the exhaust pipe 25 by suction power of the exhaust device 26. Thereby gas in the cover 229 is replaced with nitrogen gas. Also, because the nitrogen gas exhausted out of the cover 229 is exhausted into the exhaust pipe 25 by suction power of exhaust device 26, gas outside of the cover 229 (outside space) is also replaced with nitrogen gas. The second valve 21 is closed by the control device 3 after replacement of the gas both inside and outside of the cover 229 with nitrogen gas.

Thereafter a etching step for supplying HF vapor onto the substrate W. To be more specific, the control device 3 decreases exhaust flow rate out of the chamber 5 from the exhaust flow rate in the preprocess step, by weakening suction power exerted by the exhaust device 26. To do this, the control device 3 may either decrease exhaust pressures (or suction power) of the exhaust device 26 to a etching exhaust flow rate weaker than the preprocess exhaust flow rate, or deactivate suction by the exhaust device 26. The control device 3 opens the communication valve 14 (FIG. 1), the first valve 17, and the second valve 21, with exhaust flow rate decreased; thereby HF vapor from the HF vapor generator 4 is supplied into the cover 229. Thereby nitrogen gas in the cover 229 is replace with HF vapor, along with supply of HF vapor into the substrate W. In the same manner, HF vapor exhausted out of the cover 229 is supplied to the outside of the cover 229, gas in the chamber 5 is replaced with HF vapor. Accordingly, HF vapor is supplied to the substrate W, and substrate W is etched. After a given lapse from when the communication valve 14, the first valve 17, and the second valve 21 are opened, the control device 3 deactivates the supply of HF vapor to the substrate W by closing the communication valve 14, the first valve 17, and the second valve 21.

Thereafter a post-process step for replacing gas in the chamber 5 with nitrogen gas is executed. To be more specific, the control device 3 increases suction power of the exhaust device 26, or restarts suction exerted by the exhaust device 26 to increase exhaust flow rates of gas from the chamber 5 in contrast to exhaust flow rates in the etching step. That is, the control device 3 increases exhaust flow rates (or suction power) exerted by the exhaust device 26 to a post-processing exhaust rate. And then the control device 3 opens the second valve 21 with exhaust flow rates increased. Thereby the gas inside and outside of the cover 229 is replaced with nitrogen gas. Thereafter the control device 3 deactivates the supply of nitrogen gas to the cover 229 by closing the second valve 21.

Thereafter, a transport step for transporting the substrate W out of the chamber 5 is executed. To be more specific, the control device 3 transports the cover 229 from the processing position to the retreat position; and moves the shutter 13 from the closing position to the opening position. And then the control device 3 transports the substrate W out of the chamber 5 by transport robot, in a state that the cover 229 and the shutter 13 are respectively positioned at the closing position and the opening position. Subsequently the control device moves the shutter 13 to the closing position.

As shown hereinabove, in the second preferred embodiment, along with lowering suction power of the exhaust device 26 in the etching step, HF vapor is supplied into the inside of the cover 229 (inside space) with the substrate W covered therewith. Gas inside the cover 229 flows more slowly because the flow is impeded by the inner surface of the cover 229. This contributes to smaller variations among flow rates of gas across the substrate, permitting even more uniform processing for the whole substrate surface.

The Third Preferred Embodiment

The third preferred embodiment of the invention will be described hereinbelow.

Figure 7:
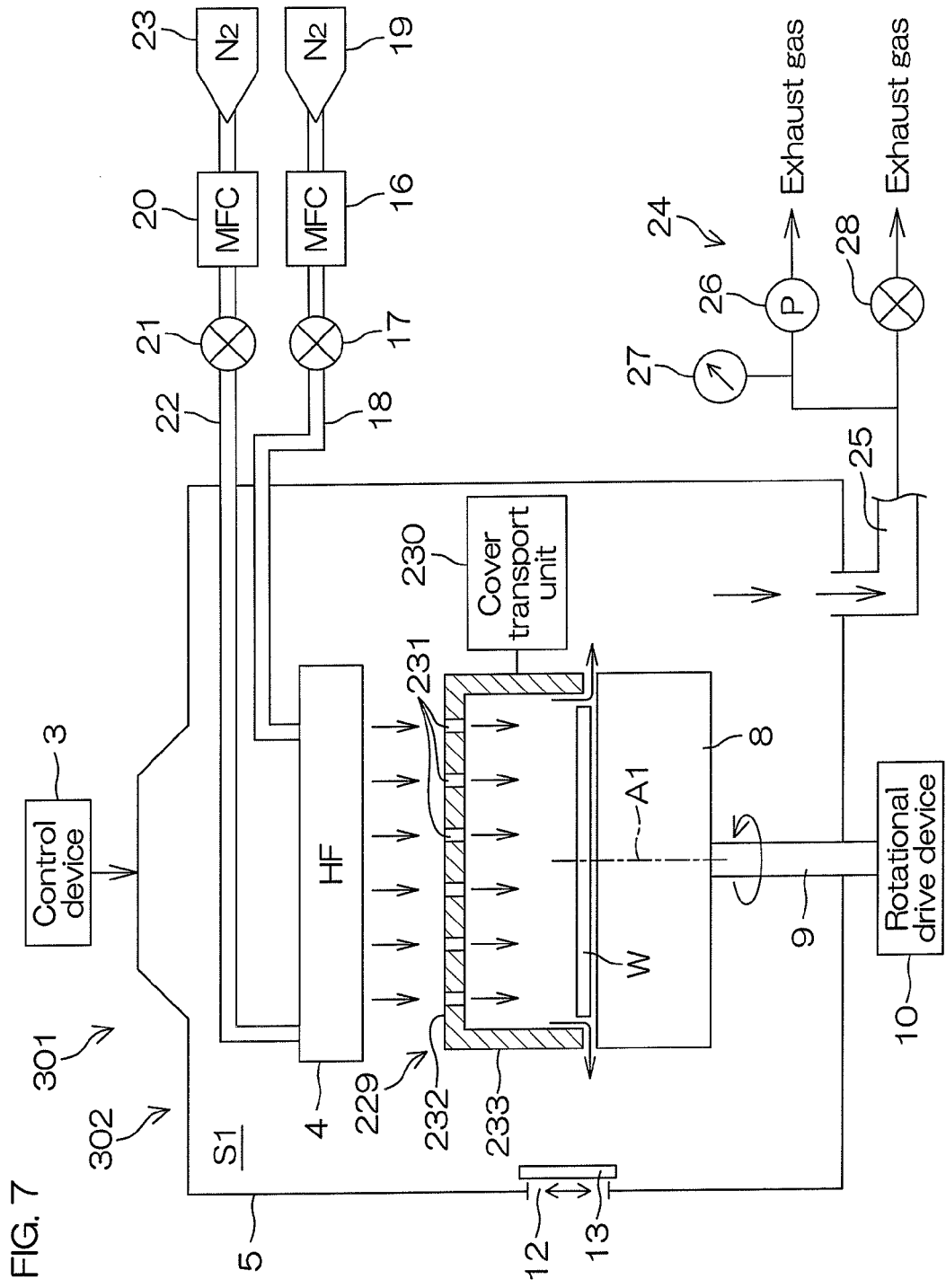
FIG. 7 is a schematic side view of a part of substrate processing apparatus according to the third preferred embodiment.

In FIG. 7, like parts shown in aforementioned FIG. 1 to FIG. 6 are given corresponding like reference numerals, and hence explanations thereof omitted.

FIG. 7 is a schematic side view of a part of substrate processing apparatus 301 according to the third preferred embodiment.

A substrate processing apparatus 301 is configured in a similar manner as in the first preferred embodiment. To be more specific, the substrate processing apparatus 301 includes a process unit 302 instead of a process unit 2. The process unit 302 includes a plurality of HF vapor generators 4, a chamber 5, a perforated plate 7, a hot plate 8, a rotational shaft 9, a rotational drive device 10, and an exhaust unit 24. The process unit 202 also includes a cover 229 and a cover transport unit 230. The HF vapor generator is disposed above the cover 4. The cover transport unit 230 moves the cover 229 between a processing position at which a lower edge of the side wall 233 comes close to the upper face of the hot plate 8, surrounding the substrate W, without contacting neither the substrate W nor the hot plate 8; and a retreat position at which the lower edge of the side wall 233 is positioned above the substrate W.

The control device 3 processes the substrate W in the similar manner as in the aforementioned first and second example of processing. The control device 3 decreases exhaust flow rate out of the chamber 5 in contrast to exhaust flow rates in the preprocess step of post-process step in the etching step. Furthermore, the control device 3 controls the HF vapor generator 4 to dispense HF vapor in a state such that the substrate W is held by the hot plate 8, and the cover 229 is positioned at the processing position. HF vapor dispensed from the HF vapor generator 4 flows into the cover 229 via a plurality of communication holes 231. HF vapor flown into the cover 229 downwardly flows through the cover 229, pushing out gas thereinside. Therefore, as shown by the arrows in FIG. 7, gas in the cover 229 is exhausted to the outside of the cover 229, passing through the gap between the lower edge of the side wall 233 and the hot plate 8. Thus gas in the chamber 5 containing nitrogen gas is replaced with HF vapor, filing the cover 229 with HF vapor, accordingly supplying HF vapor to the substrate W to etch the substrate W.

As described hereinabove, in the third preferred embodiment, along with decreasing suction power of the exhaust device 26 in the etching step, HF vapor is supplied into the inside of the cover 229 (inside space) with the substrate W being covered therewith. HF vapor flowed into the cover 229 is exhausted through the narrow gap between the lower edge of the side wall 233 and the hot plate 8, further decreasing the gas flow velocity in the cover 229. This contributes to further decrease of the variations of flow rates of gas across the substrate W, permitting even more uniform processing for the whole surface area of the substrate W.

The Fourth Preferred Embodiment

The fourth preferred embodiment of the invention will be described hereinbelow.

Figure 8:
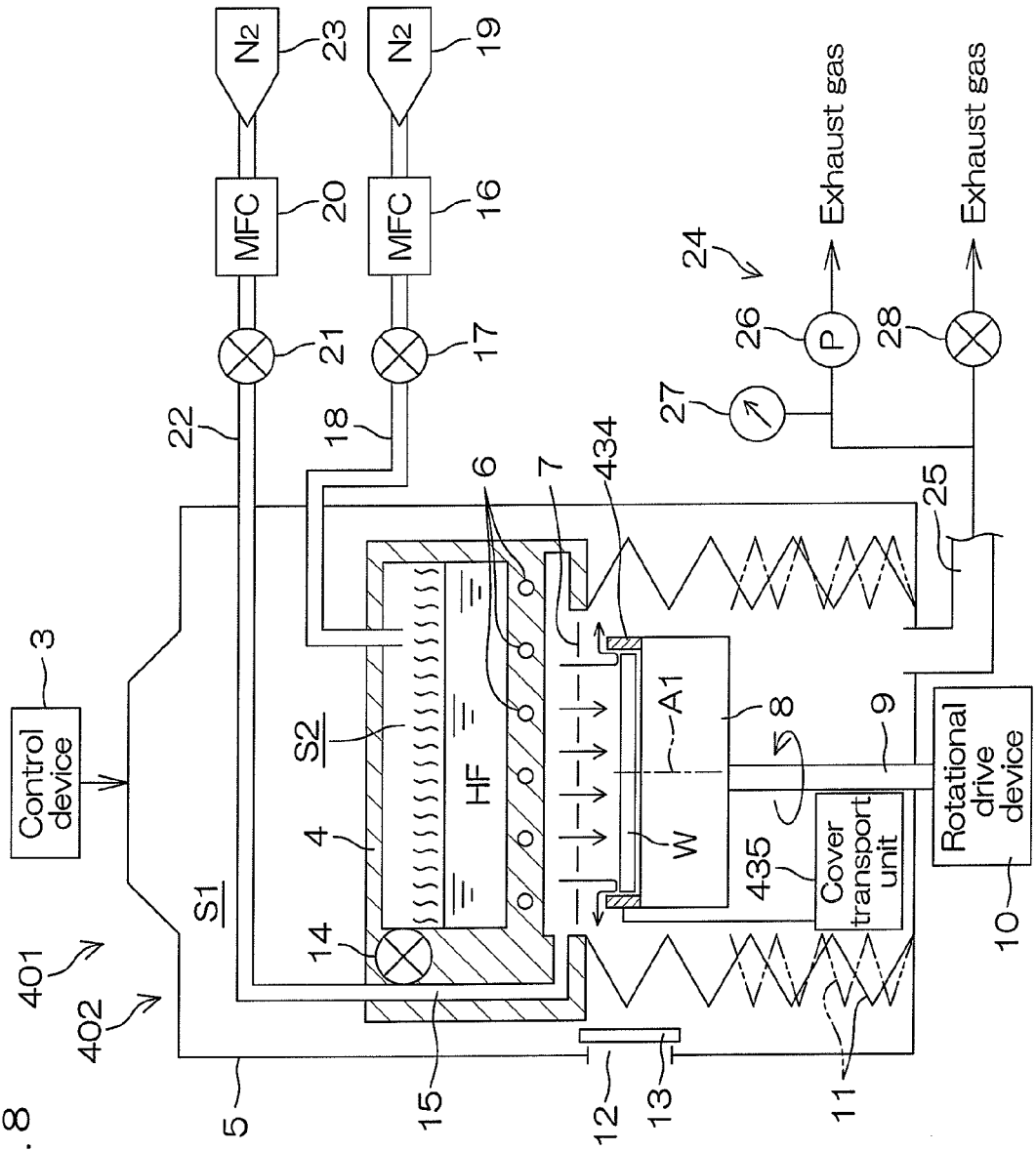
FIG. 8 is a schematic side view of a part of substrate processing apparatus according to the fourth preferred embodiment.

In FIG. 8, like parts shown in aforementioned FIG. 1 to FIG. 7 are given corresponding like reference numerals, and hence explanations thereof omitted.

FIG. 8 is a schematic side view of a part of substrate processing apparatus 401 according to the fourth preferred embodiment.

A substrate processing apparatus 401 is configured in a similar manner as in the first preferred embodiment. To be more specific, the substrate processing apparatus 401 includes a process unit 402 instead of a process unit 2. The process unit 402 includes a plurality of HF vapor generators 4, a chamber 5, a perforated plate 7, a hot plate 8, a rotational shaft 9, a rotational drive device 10, and an exhaust unit 24. The process unit 402 also includes a circular protection wall 434 disposed in the chamber 5, and a protection wall transport unit 435 for transporting the protection wall 434 within the chamber 5. The protection wall 434 concentrically encircles the substrate W held by the hot plate 8. While it is preferable that the protection wall 434 be configured in a continuously cylindrical form, the wall may be defined by divide members concentrically disposed with respect to the substrate W, with respective gaps in circumferential direction. The protection wall 434 extends from the upper face of the hot plate 8 and supported thereby. The substrate W transported by transport robot is relayed by support pins (not shown), and mounted onto the hot plate 8.

The control device 3 processes the substrate W in the similar manner as in the aforementioned first and second examples of processing. In the etching step, the control device 3 decreases exhaust flow rate out of the chamber 5 in contrast to the preprocess step or post-process step. Furthermore, the control device 3 controls the HF vapor generator 4 to dispense HF vapor in a state such that the substrate W is held by the hot plate 8. HF vapor dispensed from the HF vapor generator 4 flows into the inside space of the protection wall 434; thereby gas within the protection wall 434 is exhausted outside. Thereby gas inside of the cover 229 containing nitrogen gas is replaced with HF vapor, filing the protection wall therewith. Accordingly, HF vapor is supplied onto the substrate W, to etch the substrate W.

As described hereinabove, in the fourth preferred embodiment, along with lowering suction power of the exhaust device 26 in the etching step, HF vapor is supplied into the inside of the protection wall 434, with the substrate W encircled thereby. Thereby HF vapor is supplied to the substrate W. Because the protection wall 434 encircles the substrate W, flow of process vapor supplied to the substrate, which would flow along the substrate surface, will be impeded by the protection wall 434 as shown in the arrows in FIG. 8. Consequently gas on or above the substrate W flows more slowly, yielding smaller variation of gas flow rate on or above the substrate W. Accordingly the whole surface area of the substrate W can be more uniformly processed.

Other Forms of Embodiments

Although the first to fourth preferred embodiments of the present invention have been described hereinabove, it should be clear for those skilled in the art that the present invention may not be limited by the description in its scope and may be put into practice in other modes with various modifications within the scope of the invention limited by claims appended hereto.

For example, while HF vapor is supplied onto a rotating substrate in the first and second examples of processing, HF vapor may be supplied onto a non-rotating substrate instead. Same shall apply for the example of processing described in the third and fourth preferred embodiments.

Furthermore, while it is explained that in the third example of processing, the replacement step described in the second example of processing is not conducted before the etching step, the replacing step may be executed before the etching step. Also, the post-process step may be executed after one or more cycles of replacing and etching step. The replacing step may be conducted before the etching step likewise in the third and fourth embodiments.

In the first to fourth preferred embodiments, HF vapor (mix of fluids of hydrofluoric acid vapor and carrier gas) as a process vapor is supplied onto a substrate. But anhydrous hydrofluoric acid vapor (hydrofluoric acid is diluted with carrier solution, not water) or mixture of anhydrous hydrofluoric acid vapor and carrier gas, may be supplied onto a substrate instead. Furthermore, process vapor may be vapor containing fluorine for etching SiN, or cleaning vapor generated from either one of ammonia or hydrogen peroxide water, not being limited to vapors generated from hydrofluoric acid or anhydrous hydrofluoric acid.

Also, whereas each of process vapor (HF vapor) or inert gas (nitrogen gas) is supplied into the interior of the chamber (enclosed space) from the same unit (HF vapor generator) in the first to fourth preferred embodiments, process vapor or inert gas may be supplied from separate units Also whereas it is described that substrate processing apparatus treats circular substrates, substrates in a polygonal shape may be treated likewise.

Other various modifications on design may be possible within the limitations cited in the appended claims.

Although the preferred embodiments of the present invention have been described in detail, the embodiments are merely specific examples used to clarify the technical contents of the present invention, and the present invention should not be understood as being limited to these specific examples; and the scope of the present invention is limited solely by the appended claims.

The present application corresponds to Japanese Patent Application No. 2011-281688 filed in the Japan Patent Office on Dec. 22, 2011, and Japanese Patent Application No. 2012-177220 filed in the Japan Patent Office on Aug. 9, 2012, the entire disclosures of which are incorporated herein by reference.

What is claimed is:

1. A substrate processing method comprising:
   a preprocess step for supplying an inert gas into an enclosed space in which a substrate is disposed, while evacuating the enclosed space at a preprocess flow rate;
   an etching step after the preprocess step for supplying a process vapor into the enclosed space, while evacuating the enclosed space at an etching flow rate lower than the preprocess flow rate to form a film liquid on the substrate through condensation of the process vapor, and etching the substrate with the film liquid; and
   a post-process step after the etching step for supplying an inert gas into the enclosed space, while evacuating the enclosed space at a post-processing flow rate higher than the etching flow rate.

2. The substrate processing method according to claim 1, wherein the etching step includes at least one of the following steps:
   (a) an exhausting step for supplying the process vapor into the enclosed space, while evacuating the enclosed space at the etching flow rate; and
   (b) a step for supplying the process vapor into the enclosed space, while evacuating the enclosed space at the etching flow rate with an exhaust device for evacuating the enclosed space being stopped.

3. The substrate processing method according to claim 1, further comprising a replacing step for supplying a process vapor into the enclosed space, while evacuating the enclosed space by means of an exhaust device at a replacing flow rate higher than the etching flow rate,
   wherein the replacing step is conducted after the preprocess step and before the etching step.

4. The substrate processing method according to claim 3, further comprising a repetition step which alternates the replacing step and etching step for a plurality of times before the post-process step.

5. The substrate processing method according to claim 1,
   wherein the enclosed space contains a cover having a communication hole through which fluids flow between the inside and outside of the cover, and
   wherein the etching step includes a step for supplying a process vapor into the inside of the cover in a state such that the substrate is covered by the cover, while evacuating the enclosed space through the communication hole.

6. The substrate processing method according to claim 1, wherein the etching step includes a step for supplying a process vapor into the enclosed space, the enclosed space having a circular protection wall surrounding the substrate while evacuating the enclosed space.

7. The substrate processing method according to claim 1, wherein the substrate is a substrate having a nitride film formed thereon.

* * * * *